US012604532B2

(12) United States Patent
Nath et al.

(10) Patent No.: US 12,604,532 B2
(45) Date of Patent: Apr. 14, 2026

(54) SILICON CONTROLLED RECTIFIERS

(71) Applicant: GlobalFoundries U.S. Inc., Malta, NY (US)

(72) Inventors: Anindya Nath, Essex Junction, VT (US); Rajendran Krishnasamy, Essex Junction, VT (US); Souvick Mitra, Essex Junction, VT (US); Steven M. Shank, Jericho, VT (US); Sagar P. Karalkar, Singapore (SG)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 419 days.

(21) Appl. No.: 18/300,161

(22) Filed: Apr. 13, 2023

(65) Prior Publication Data

US 2024/0347528 A1     Oct. 17, 2024

(51) Int. Cl.
*H10D 89/60*          (2025.01)
*H10D 8/60*           (2025.01)

(52) U.S. Cl.
CPC ........... *H10D 89/713* (2025.01); *H10D 8/605* (2025.01)

(58) Field of Classification Search
CPC ........ H10D 8/605; H10D 30/80; H10D 48/38; H10D 62/106; H10D 62/13; H10D 64/23; H10D 89/713
See application file for complete search history.

(56) References Cited

U.S. PATENT DOCUMENTS

| | | | |
|---|---|---|---|
| 5,453,384 A * | 9/1995 | Chatterjee | ................ H10D 8/80 257/107 |
| 5,682,047 A * | 10/1997 | Consiglio | ............ H10D 89/601 361/111 |
| 5,923,067 A | 7/1999 | Voldman | |
| 6,268,992 B1 | 7/2001 | Lee et al. | |
| 6,465,848 B2 * | 10/2002 | Ker | ...................... H10D 89/713 257/361 |
| 6,768,619 B2 | 7/2004 | Ker et al. | |
| 6,909,149 B2 | 6/2005 | Russ et al. | |
| 8,399,921 B2 | 3/2013 | Ding et al. | |
| 8,399,927 B2 | 3/2013 | Ding et al. | |
| 8,735,968 B2 * | 5/2014 | Li | ........................ H10D 30/668 257/331 |
| 8,809,905 B2 | 8/2014 | Lin et al. | |
| 8,815,654 B2 | 8/2014 | Gauthier, Jr. et al. | |

(Continued)

OTHER PUBLICATIONS

Vaschenko et al., "Multi-port ESD protection using bi-directional SCR structures", IEEE, Conference: Bipolar/BiCMOS Circuits and Technology Meeting, Oct. 2003, Abstract, 3 pages.

(Continued)

*Primary Examiner* — Eduardo A Rodela
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to silicon control rectifiers and methods of manufacture. A structure includes: a first well in a semiconductor substrate; a second well in the semiconductor substrate, adjacent to the first well; a plurality of shallow trench isolation structures extending into the first well and the second well; and at least one gate structure in the first well which abuts one shallow trench isolation structure of the plurality of shallow trench isolation structures.

19 Claims, 7 Drawing Sheets

(56)                    References Cited

U.S. PATENT DOCUMENTS

| 9,006,783 | B2 | | 4/2015 | Di Sarro et al. |
| 9,748,220 | B1 | * | 8/2017 | Lin ...................... H10D 89/713 |
| 10,700,186 | B2 | * | 6/2020 | Zhu ...................... H10D 62/115 |
| 11,316,045 | B2 | | 4/2022 | Stamper et al. |
| 11,393,806 | B2 | * | 7/2022 | Fiorenza ........... H01L 21/76898 |
| 2003/0213971 | A1 | | 11/2003 | Yu |
| 2008/0308837 | A1 | | 12/2008 | Gauthier, Jr. et al. |
| 2014/0015052 | A1 | | 1/2014 | Fenouillet-Beranger et al. |
| 2014/0349464 | A1 | | 11/2014 | Yang et al. |
| 2015/0187749 | A1 | | 7/2015 | Dai |
| 2016/0013205 | A1 | | 1/2016 | Vinet et al. |
| 2021/0159336 | A1 | | 5/2021 | Stamper et al. |

OTHER PUBLICATIONS

Jung et al., "A Design of BJT-based ESD Protection Device combining SCR for High Voltage Power Clamp", Journal of Semiconductor Technology and Science, Jun. 30, 2014, vol. 14, No. 3, 6 pages.
Do et al., "A New Dual-Direction SCR with High Holding Voltage and Low Dynamic resistance for 5V Application", Electron Devices Society, May 13, 2019, vol. 7, 5 pages.
Specification and Drawings filed on Mar. 7, 2023 in U.S. Appl. No. 18/118,323, 27 pages.
Specification and Drawings filed on Dec. 17, 2021 in U.S. Appl. No. 17/554,222, 28 pages.

* cited by examiner

SILICON CONTROLLED RECTIFIERS

BACKGROUND

The present disclosure relates to semiconductor structures and, more particularly, to silicon control rectifiers and methods of manufacture.

A silicon controlled rectifier (SCR) is a solid-state current-controlling device, which is a unidirectional device (i.e., can conduct current only in one direction). The SCR typically includes a switching configuration comprising p-n-p-n layers.

A holding current of an SCR can be defined as the smallest amount of current under which an anode current has to drop to enter an OFF status. This means if the holding current value is 5 mA, for example, subsequently the SCR's anodes' current has to turn into less than 5 mA to discontinue performing. A triggering voltage, on the other hand, may occur when the anode terminal is made +ve relating to the cathode in which case the SCR will be in a forwarding biased mode, e.g., enters into the forward blocking state. This means the device is switched from the blocked (OFF) state to the unblocked (ON) state.

SUMMARY

In an aspect of the disclosure, a structure comprises: a first well in a semiconductor substrate; a second well in the semiconductor substrate, adjacent to the first well; a plurality of shallow trench isolation structures extending into the first well and the second well; and at least one gate structure in the first well which abuts one shallow trench isolation structure of the plurality of shallow trench isolation structures.

In an aspect of the disclosure, a structure comprises: a first well in a semiconductor substrate and electrically coupled to an anode; a second well in the semiconductor substrate and electrically coupled to a cathode; and at least one vertical gate structure extending vertically within the semiconductor substrate and which sits between the anode and the cathode.

In an aspect of the disclosure, a method comprises: forming a first well in a semiconductor substrate; forming a second well in the semiconductor substrate, adjacent to the first well; forming a plurality of shallow trench isolation structures extending into the first well and the second well; and forming at least one gate structure in the first well which abuts one shallow trench isolation structure of the plurality of shallow trench isolation structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to silicon control rectifiers and methods of manufacture. More specifically, the present disclosure relates to a vertical field effect transistor(s) (FET) integrated with a silicon control rectifier (SCR). For example, in embodiments, the vertical FET couples an N-well to a cathode of the SCR. Advantageously, the vertical FET integrated with the SCR provides a controllable and reduced trigger voltage, reduced foot-print compared to conventional FET-trigger SCRs, and reduced risk of gate oxide breakdown during an electrostatic discharge (ESD) event.

More specifically, the SCR includes one or more islands of vertical FETs within trenches of a semiconductor substrate and which sits between anodes and cathodes. For example, the SCR includes a first well and a second well abutting the first well along a junction. The gate structures, e.g., FETs, extend near the junction and can extend to a predefined depth to within the semiconductor substrate underneath the first and second wells. In embodiments, the wells include a P-well and an N-well. The gate structures can be a single gate structure or a plurality of gate structures, e.g., a single island or a plurality of islands. A shallow trench isolation structure is provided between the anode and cathode, with the gate island(s) being adjacent to the shallow trench isolation structure. Shallow trench isolation structures may also be used to isolate the diffusion regions of the P-well and the N-well.

The SCR of the present disclosure can be manufactured in a number of ways using a number of different tools. In general, though, the methodologies and tools are used to form structures with dimensions in the micrometer and nanometer scale. The methodologies, i.e., technologies, employed to manufacture the SCR of the present disclosure have been adopted from integrated circuit (IC) technology. For example, the structures are built on wafers and are realized in films of material patterned by photolithographic processes on the top of a wafer. In particular, the fabrication of the SCR uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
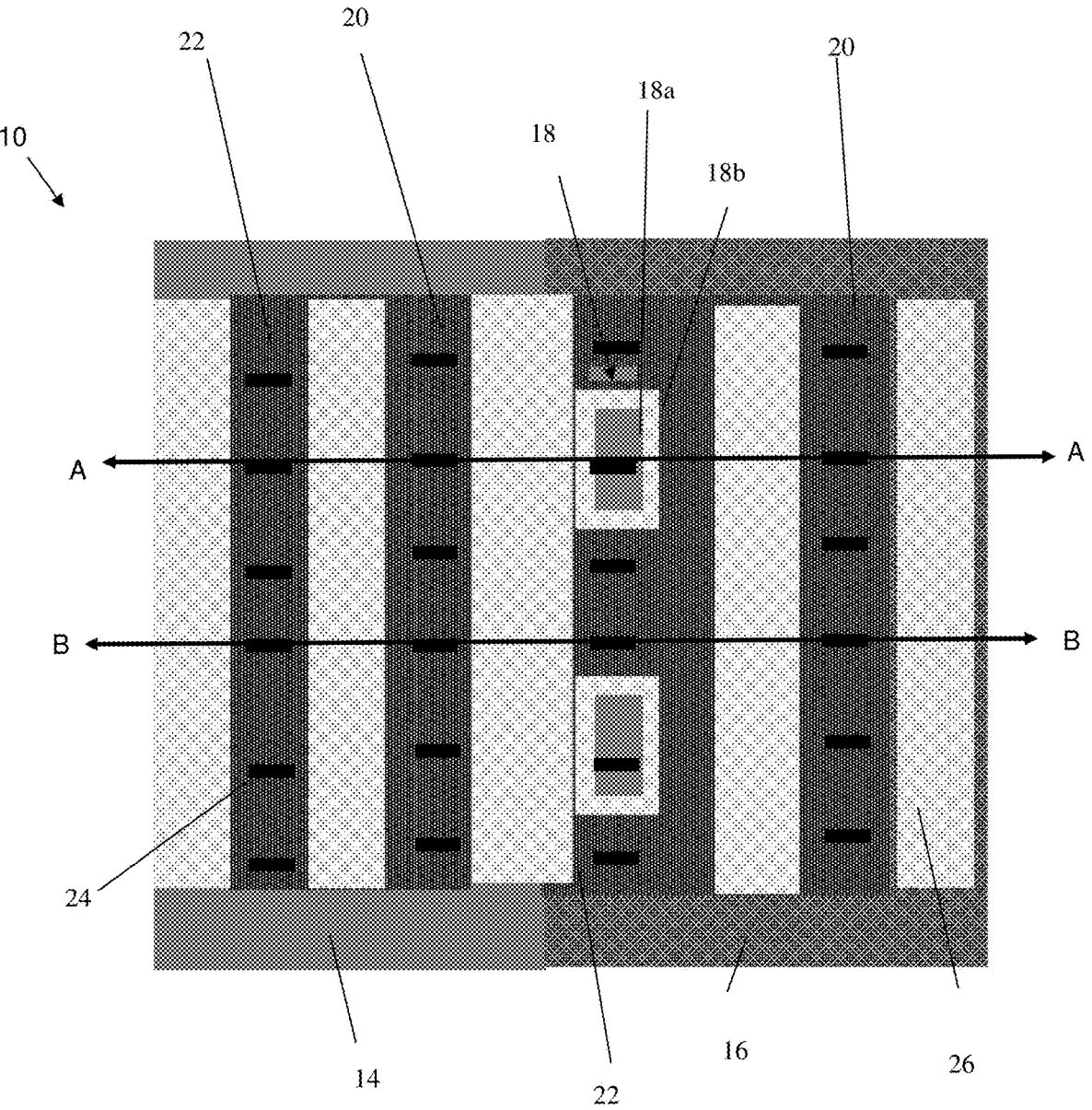
FIG. 1A shows a top view of a vertical field effect transistor (FET) integrated with a silicon controlled rectified (SCR), amongst other features, and respective fabrication processes in accordance with aspects of the present disclosure.
Figure 1B:
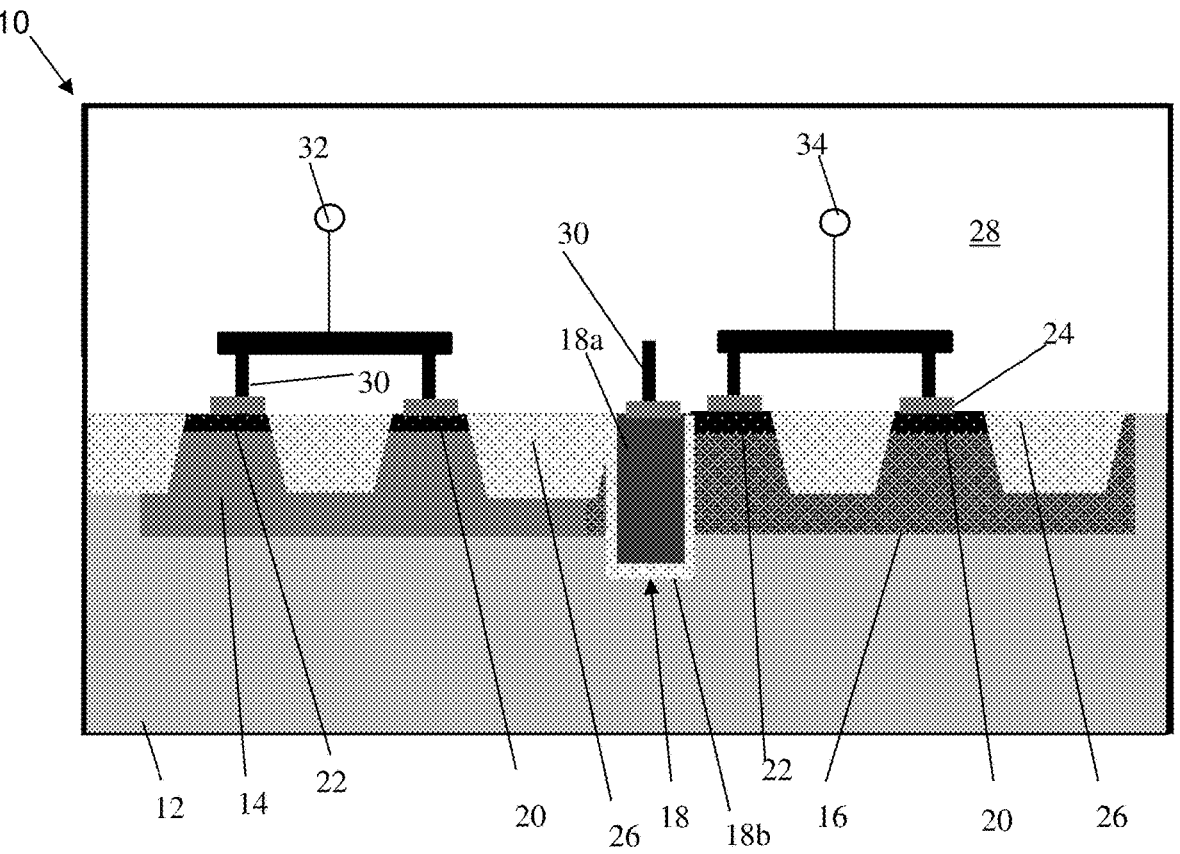
FIG. 1B shows a cross-sectional view of the SCR of FIG. 1A along line A-A.
Figure 1C:
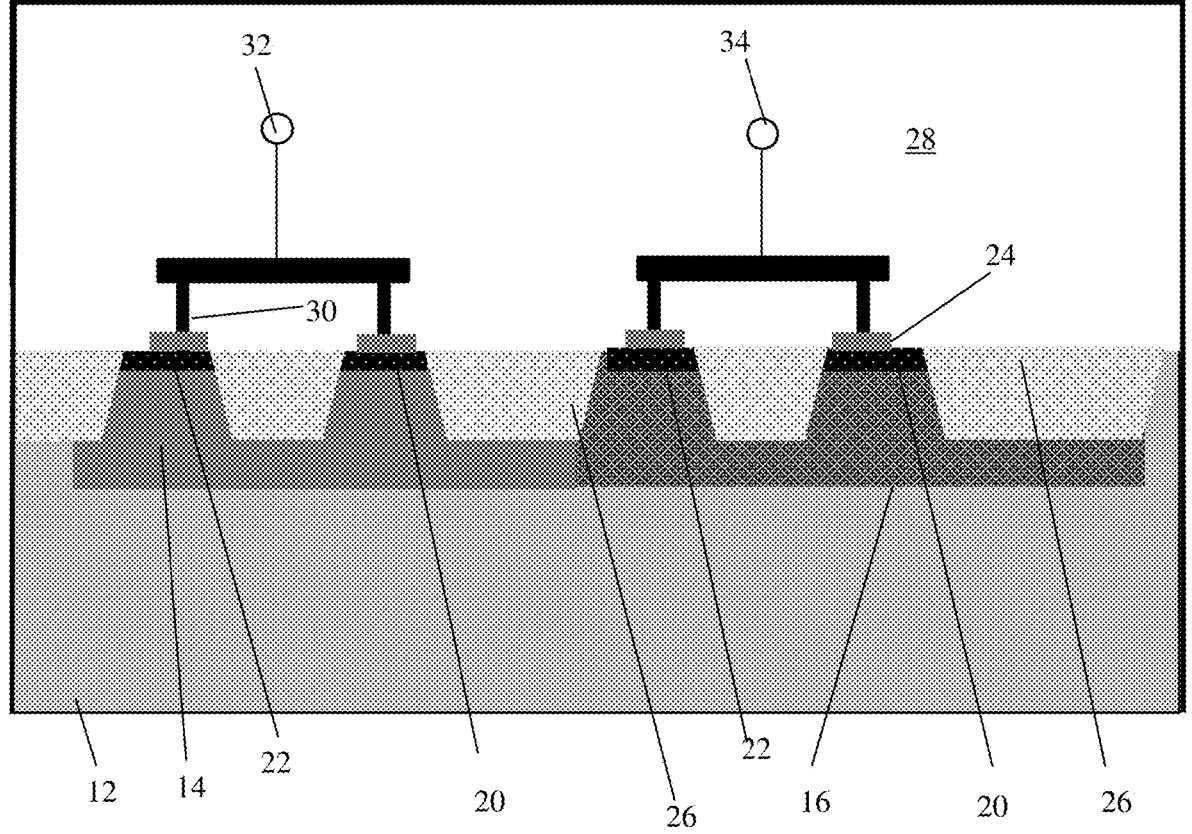
FIG. 1C shows a cross-sectional view of the SCR of FIG. 1A along line B-B.

FIG. 1A shows a top view of a FET integrated with a silicon controlled rectified (SCR) and respective fabrication processes in accordance with aspects of the present disclosure. FIG. 1B shows a cross-sectional view of the SCR of FIG. 1A along line A-A and FIG. 1C shows a cross-sectional view of the SCR of FIG. 1A along line B-B. Line A-A also represents a secondary current path; whereas line B-B represents a primary current path (e.g., primary electrostatic discharge (ESD) path). In the current path along line A-A, the gate structure 18 creates electrons (e.g., when a gate bias is applied) vertically deeper into the semiconductor substrate 12 which, in turn, induces an avalanche breakdown at an earlier time (compared to conventional devices).

Referring to FIGS. 1A-1C, the structure 10 includes islands of vertical gate structures 18 (e.g., FETs) between anodes 32 and cathodes 34. In embodiments, the gate structures 18 provide a tunable trigger voltage. Also, in embodiments, the gate structures 18 lower the trigger voltage by directing electrons vertically along a junction of an N-well 14 and a P-well 16.

More specifically, the structure 10 of FIG. 1 includes a semiconductor substrate 12 composed of any suitable material including, but not limited to, Si, SiGe, SiGeC, SiC, GaAs, InAs, InP, and other III/V or II/VI compound semiconductors. The semiconductor substrate 12 may be a lightly doped p-type semiconductor substrate. In more specific embodiments, the semiconductor substrate 12 may be a lightly doped p-type, single crystalline Si substrate with any suitable crystallographic orientation (e.g., a (100), (110), (111), or (001) crystallographic orientation).

The semiconductor substrate 12 may include the wells 14, 16. In embodiments, the well 14 may be an N-well and the well 16 may be P-well. In embodiments, the wells 14, 16 are abutting one another, e.g., forming a PN junction. As described in more detail with respect to FIG. 5D, the wells 14, 16 may be formed by introducing different dopant types into the semiconductor substrate 12 by, for example, ion implantation processes.

A plurality of vertical gate structures 18 may be provided in the semiconductor substrate 12 and, more specifically, within the P-well 16. As shown in FIG. 1A, for example, the gate structures 18 may extend within and through diffusion region 22, (e.g., N+ diffusion region) in the P-well 16. The gate structures 18 should preferably be remotely positioned from the N-well 14. For example, the gate structures 18 may be isolated from the N-well 20 by being positioned entirely within the P-well 16, with a shallow trench isolation structure 26 abutting to the gate structures 18 and extending between the junction of the P-well 16 and the N-well 14. In this configuration, the vertical gate structures 18 may be vertical nFETs within the P-well 16. In alternative embodiments, nFETs may be provided in a triple well via a deep n-Well.

Also, as shown in FIG. 1A, for example, the vertical gate structures 18 may be a plurality of islands in the P-well 16. The vertical gate structures 18 may be provided within a trench formed in the P-well 16 and extending through the diffusion region 22. As shown in FIG. 1B, the vertical gate structures 18 may also extend into the underlying semiconductor substrate 12 below a bottom surface of the P-well 16. Alternatively, the vertical gate structures 18 may be at different depths within the semiconductor substrate 12, e.g., remain entirely within the P-well 16 at different depths depending on desired design parameters. For example, different depths of the vertical gate structure 18 can be used to tune the breakdown voltage of the SCR. By way of more specific example, the depths of the vertical gate structures 18 and the shallow trench isolation structures 26 may be the same, e.g., a depth of 1 micron or more.

The vertical gate structures 18 include a gate electrode 18a and a gate dielectric material 18b. For example, the gate electrode 18a may be a polysilicon material; although workfunction metals (N-type workfunction metals) are also contemplated herein, e.g., Ti, TiAlC, Al, TiAl, TaN, TaAlC, TiN, TiC and Co, etc. The gate dielectric material 18b may be a low-k dielectric material as is known in the art, e.g., oxide based material.

Still referring to FIGS. 1A-1C, the wells 14, 16 each include diffusion regions 20, 22. The diffusion regions 20 may be P+ diffusion regions and the diffusion regions 22 may be N+ diffusion regions. The diffusion regions 20, 22 may be formed by conventional ion implantation processes (or diffusion processes as is known in the art). For example, the diffusion regions 20, 22 may be formed in a similar manner as the wells 14, 16 described with respect to FIG. 5D such that no further explanation is required for one of skill in the art to have a complete understanding of the present disclosure.

Silicide contacts 24 may be formed on the diffusion regions 20, 22 and the gate structure 18, e.g., polysilicon gate electrode 18a. As should be understood by those of skill in the art, the silicide contacts may be formed by a silicide process which begins with deposition of a thin transition metal layer, e.g., nickel, cobalt or titanium, over fully formed and patterned semiconductor devices (e.g., doped or ion implanted diffusion regions and polysilicon material of the gate electrode 18a). After deposition of the material, the structure is heated allowing the transition metal to react with exposed silicon (or other semiconductor material as described herein) in the active regions of the semiconductor device (e.g., doped or ion implanted diffusion regions 20, 22 and gate electrode 18a) forming a low-resistance transition metal silicide. Following the reaction, any remaining transition metal is removed by chemical etching, leaving silicide contacts in the active regions of the device. It should be understood by those of skill in the art that silicide contacts will not be required for metal gate electrodes.

Shallow trench isolation structures 26 may be provided in the wells 14, 16, separating (e.g., isolating) the diffusion regions 20, 22. In more specific embodiments, the shallow trench isolation structures 26 may extend laterally into both the wells 14, 16, extending from a top surface of the semiconductor substrate 12. As shown in FIGS. 1A-1C, the shallow trench isolation structure 26 may be provided between the P-well 16 and the N-well 14 and, more specifically, abutting against the gate structures 18 and the N+ diffusion regions 22 in the P-well 16.

The shallow trench isolation structures 26 can be formed by conventional lithography, etching and deposition methods known to those of skill in the art. For example, a resist formed over the semiconductor substrate 12, e.g., wells 14, 16, is exposed to energy (light) and developed utilizing a conventional resist developer to form a pattern (opening). An etching process with a selective chemistry, e.g., reactive ion etching (RIE), will be used to transfer the pattern from the photoresist layer to the semiconductor substrate 12, e.g., wells 14, 16, to form one or more trenches in the through the openings of the resist. Following the resist removal by a conventional oxygen ashing process or other known stripants, insulator material (e.g., oxide material) can be deposited by any conventional deposition processes, e.g., chemical vapor deposition (CVD) processes. Any residual material on the surface of the semiconductor substrate 12 6can be removed by conventional chemical mechanical polishing (CMP) processes.

FIGS. 1A-1C also representatively show contacts and/or wiring structures 30 to electrically couple the anode 32 and the cathode 34 to the respective wells 14, 16. For example, in embodiments, the anode 32 is electrically connected to the diffusion regions 20, 22 of the N-well 14 and the cathode 34 is electrically connected to the diffusion regions 20, 22 of the P-well 16. The contacts and/or wiring structures 30 may be formed in interlevel dielectric material 28 and electrically connected to the silicide contacts 24 on the diffusion regions 22, 24, in addition to the gate electrode 18a.

The contacts and/or wiring structures 30 may be formed by conventional single or dual damascene processes, e.g., lithography, etching and deposition processes. For example, an interlevel dielectric material 28 may be formed over the semiconductor substrate 12, e.g., over the N+ diffusion regions 22, P+ diffusion regions 20, shallow trench isolation structures 26, and vertical gate structures 18. The interlevel dielectric material 28 may comprise a combination of nitride and/or oxide based materials, e.g., SiN and SiO$_2$, deposited using conventional deposition processes, e.g., chemical vapor deposition (CVD).

Vias or trenches may be formed within the interlevel dielectric material 28 to expose the N+ diffusion regions 22, P+ diffusion regions 20 and the gate electrodes 18a. The vias or trenches may be formed using conventional lithography and etching processes as described herein such that no further explanation is required for a complete understanding of the present disclosure. After silicide formation, the contacts and/or wiring structures 30 may be formed within the vias or trenches of the interlevel dielectric material 28, connecting to the N+ diffusion regions 20, P+ diffusion regions 24 and the gate electrode 18a. The contacts may be tungsten, for example, lined with TaN or TiN and the wiring structures may be aluminum. The contacts and/or wiring structures 30 may be deposited using a conventional deposition process, e.g., CVD, followed by a CMP process to remove any excessive material on the surface of the interlevel dielectric material 28.

Figure 2:
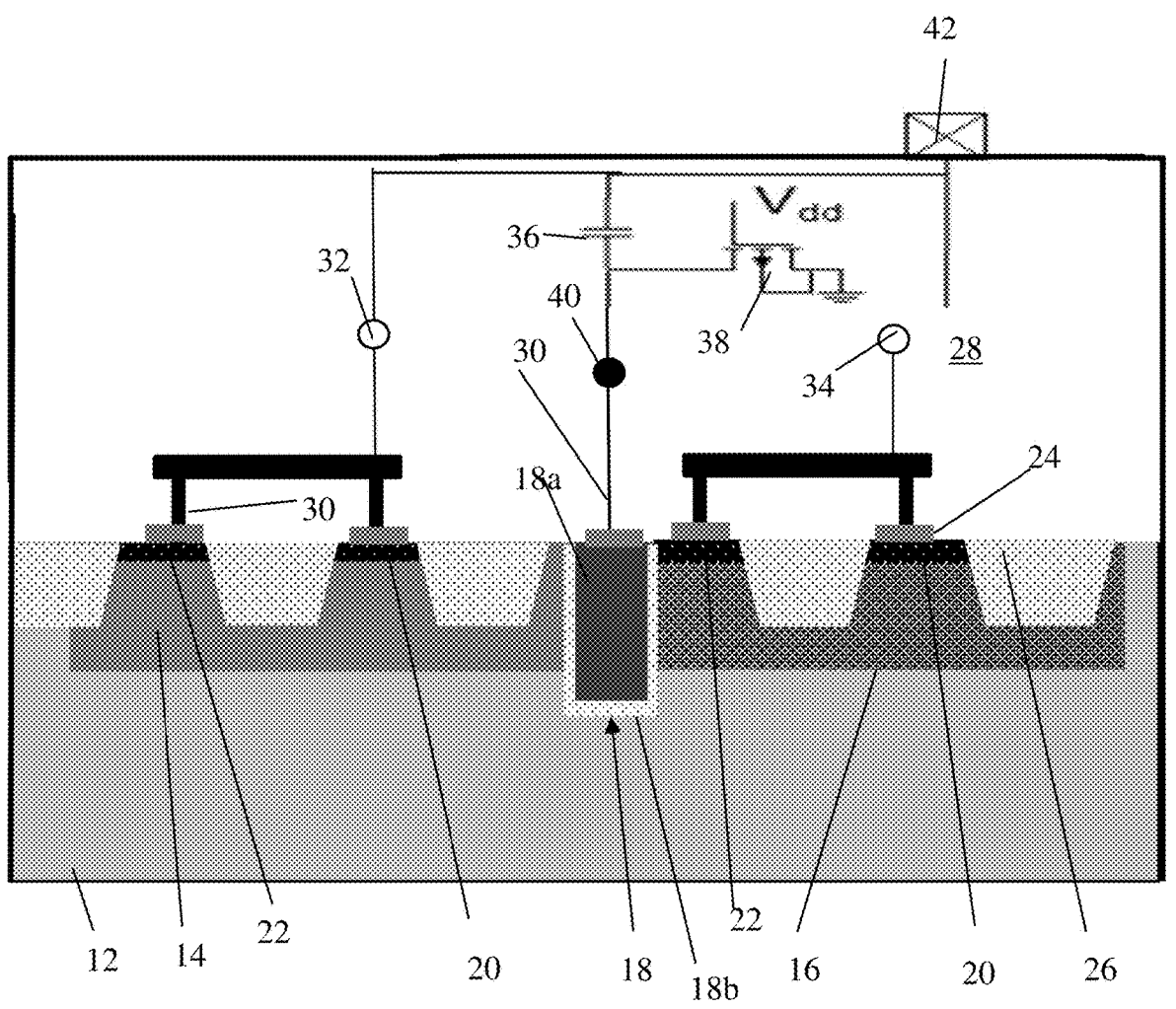
FIG. 2 shows an operational use of the vertical FET integrated SCR of FIGS. 1A-1C in accordance with aspects of the present disclosure.

FIG. 2 shows an operational use of the vertical FET integrated SCR of FIGS. 1A-1C in accordance with aspects of the present disclosure. As shown, the gate structure 18 is connected to a capacitor 36 and node 40. The capacitor 36 may be a back end of the line capacitor as is known in the art. A FET 38 may be connected between ground (GND) and Vdd. In an ESD condition, Vdd is floating (OV) and the FET 38 is OFF which will then offer a high impedance. In this operating state, the node 40 sees a fraction of the voltage from pad 42. Also, in this operating state, the SCR is ON at a low voltage because part of the voltage is applied to the gate structure 18. In a normal operating condition, Vdd is 1, the FET 38 is fully turned ON, node 40 is at 0 and the SCR is turned OFF. Also, in this configuration, as there are two current paths, the holding voltage will remain the same, i.e., the current path along line B-B is not pushed vertically down since there is no gate structures in this current path.

Figure 3:
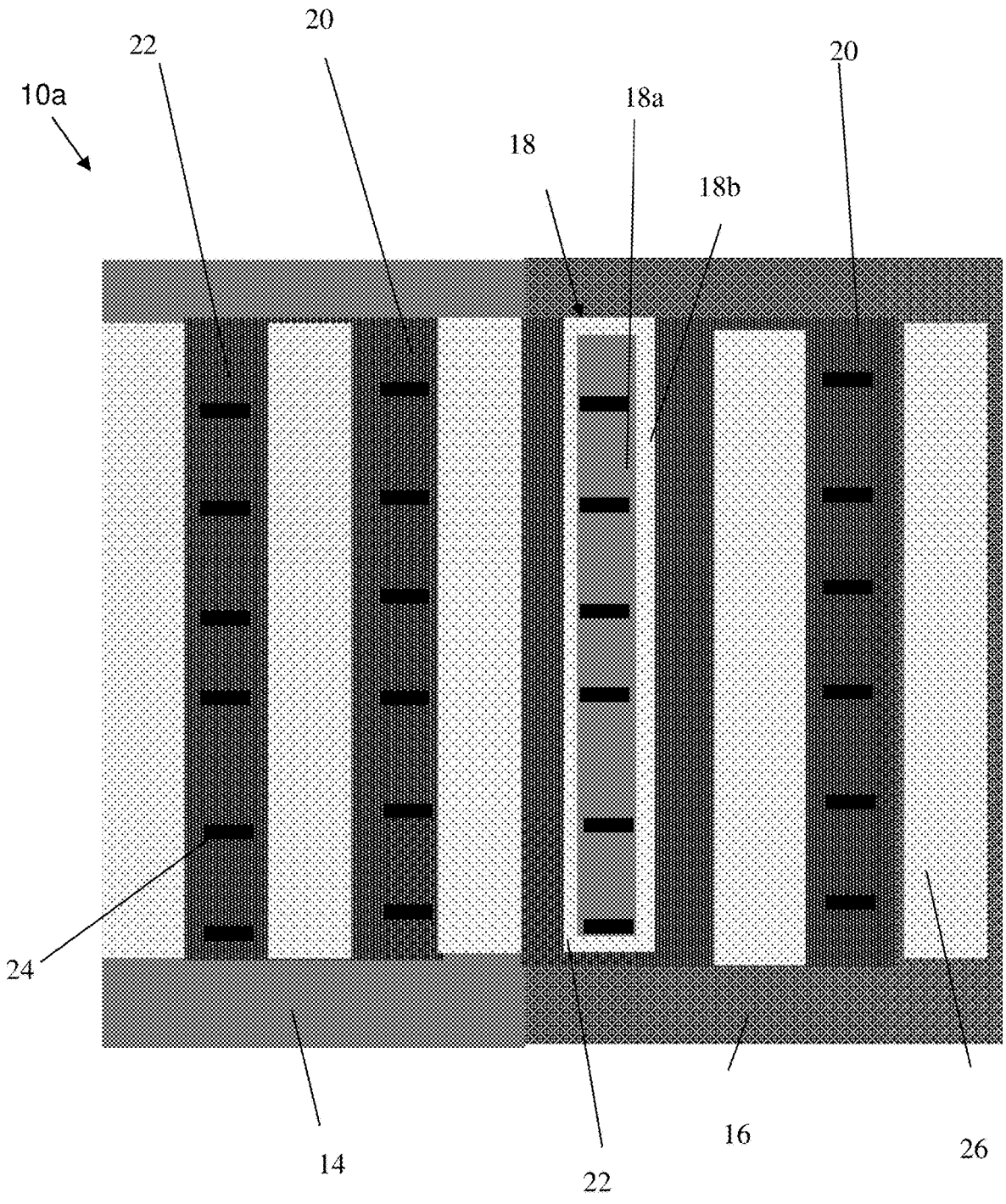
FIG. 3 shows a top view of an SCR in accordance with further aspects of the present disclosure.

FIG. 3 shows a top view of an SCR in accordance with further aspects of the present disclosure. In the structure 10a of FIG. 3, the gate structure 18 is a single gate structure placed in between the entirety of the anode 32 and the cathode 34. More specifically, the gate structure 18 is a single gate structure within the P-well 16 (e.g., cathode). In this configuration, only a single current path is provided, which is under the gate structure 18. Accordingly, in this configuration, the gate structure 18 provides a high holding voltage as there is no alternative current path as noted with respect to FIG. 1A, e.g., current path along line B-B no longer exists. The remaining features of the structure 10a are similar to the structure 10 of FIGS. 1A-1C.

Figure 4:
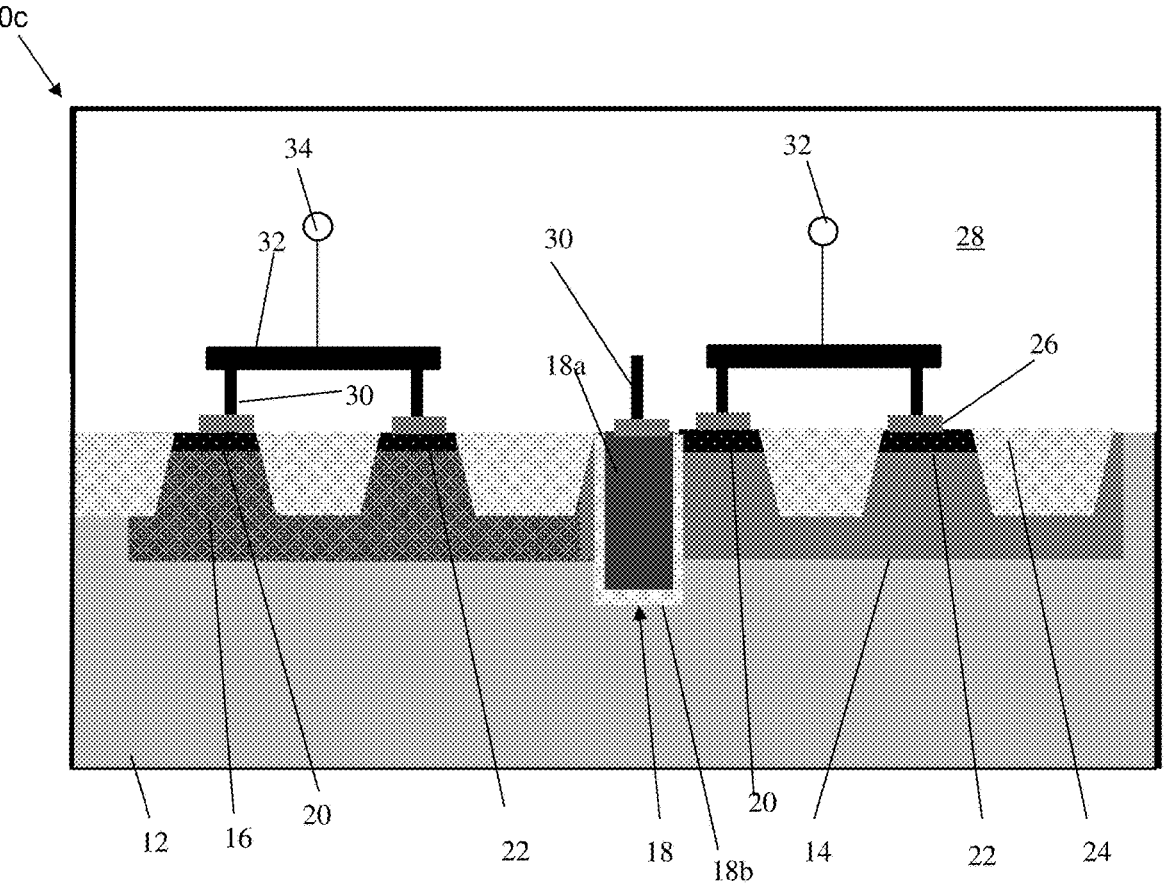
FIG. 4 shows a cross-sectional view of an SCR in accordance with yet additional aspects of the present disclosure.

FIG. 4 shows an SCR in accordance with additional aspects of the present disclosure. In the structure 10b of FIG. 4, the gate structure 18 is provided in the anode side of the device; that is, the gate structure 18 is provided in the N-well 14 (compared to the P-well 16 shown in FIGS. 1A-3). In this configuration, the gate structure 18 is a pFET, which extends through the P+ diffusion region 20 of the N-well 14.

Moreover, in this embodiment, the gate structure 18 may be a plurality of gate structures similar to the structure 10 shown in FIGS. 1A-1C or a single gate structure similar to the structure 10a shown in FIG. 3.

Figure 5A:
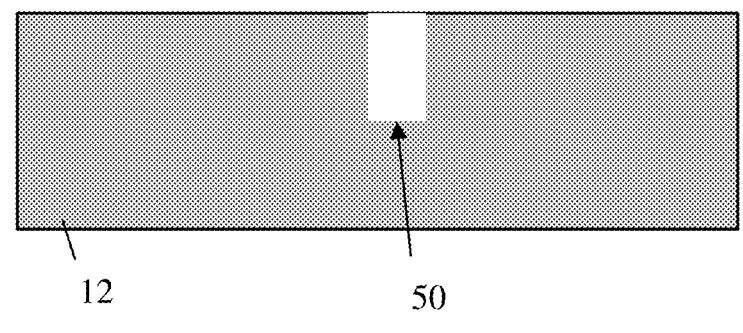
FIGS. 5A-5D show fabrication processes for manufacturing the SCR of FIGS. 1A-1C.

FIGS. 5A-5D show fabrication processes for manufacturing the SCR of FIGS. 1A-1C. FIG. 5A shows a trench formation in the semiconductor substrate 12. More specifically, in FIG. 5A, a trench 50 may be formed in the semiconductor substrate 12 by conventional lithography and etching processes.

Figure 5B:
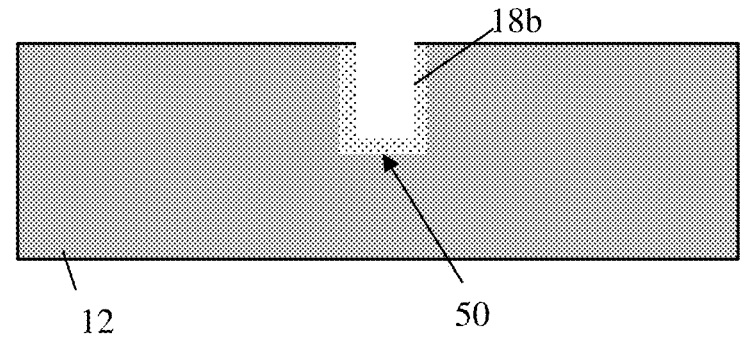

In FIG. 5B, the trench 50 may be oxidized to form the gate dielectric material 18b. In embodiments, the oxidization process creates an SiO$_2$ layer, for example, which serves as an insulating layer that blocks leakage current. In embodiments, the oxidization process may be, e.g., thermal oxidation, plasma-enhanced chemical vapor deposition (PECVD), or electrochemical anodic oxidation to name a few contemplated processes. In embodiments, oxide formed on the surface of the semiconductor substrate 12 may be removed by a CMP process, leaving the gate dielectric material 18b within the trench 50.

Figure 5C:
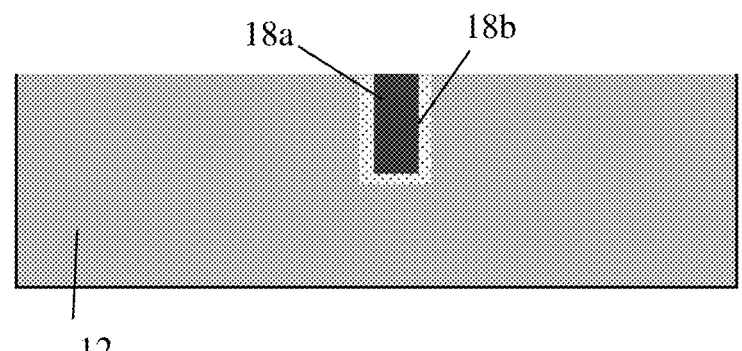

In FIG. 5C, a polysilicon material 18a is deposited within the trench 50. In embodiments, the polysilicon material 18a may be a doped polysilicon material, e.g., n-doped material. The polysilicon material 18a may be deposited by a conventional deposition method, e.g., CVD, followed by a CMP process.

Figure 5D:
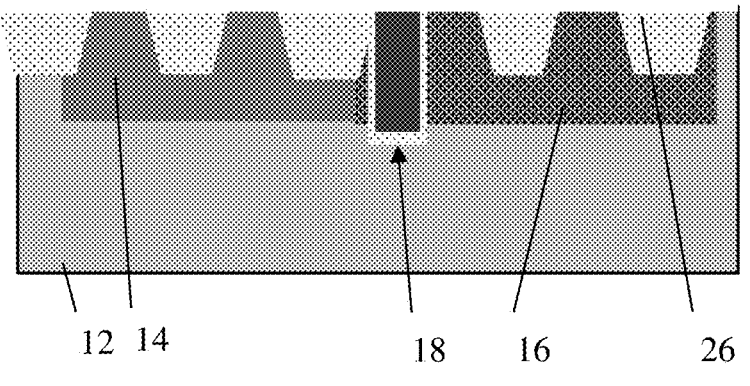

In FIG. 5D, the wells 14, 16 may be formed in the semiconductor material. In embodiments, the wells 14, 16 are formed by an ion implantation process. In the ion implantation process, for example, the wells 14, 16 may be formed by introducing a concentration of a different dopant of opposite conductivity type in the semiconductor substrate 12. For example, the P-well 16 is doped with p-type dopants, e.g., Boron (B), and the N-well is doped with n-type dopants, e.g., Arsenic (As), Phosphorus (P) and Antimony (Sb), among other suitable examples. In embodiments, the N-well 14 is formed on a drain side of the device; whereas the P-well is formed on a source side of the device.

In embodiments, respective patterned implantation masks may be used to define selected areas exposed for the implantations. The implantation mask used to select the exposed area for forming well 14 (or 16) is stripped after implantation, and before the implantation mask used to form well 16 (or 14). The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

FIG. 5D further shows the formation of the shallow trench isolation structures 26. In embodiments, the shallow trench isolation structures 26 may be formed by conventional lithography, etching and deposition processes as described herein.

Referring back to FIGS. 1A-1C, the diffusion regions 20, 22, silicide contacts 24 and contacts and wiring structures 30 are provided using conventional CMOS processes, e.g., lithography, etching and deposition processes.

The SCR can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first well in a semiconductor substrate;
a second well in the semiconductor substrate, adjacent to the first well;
a plurality of shallow trench isolation structures extending into the first well and the second well; and
at least one gate structure in the first well which abuts one shallow trench isolation structure of the plurality of shallow trench isolation structures,
wherein the at least one gate structure is within the first well.

2. The structure of claim 1, wherein the first well comprises a P-well and the second well comprises an N-well.

3. The structure of claim 1, wherein the first well comprises an N-well and the second well comprises a P-well.

4. The structure of claim 1, wherein the at least one gate structure comprises at least one vertical gate structure extending between an anode and a cathode.

5. The structure of claim 1, wherein the at least one gate structure comprises at least one vertical gate structure extending below a bottom surface of the first well.

6. The structure of claim 1, wherein the at least one gate structure comprises at least one vertical gate structure extending to a same depth as the plurality of shallow trench isolation structures.

7. The structure of claim 1, wherein the at least one gate structure comprises a plurality of gate structures within the first well.

8. The structure of claim 7, further comprising a first current path between the plurality of gate structures and a second current path under the plurality of gate structures.

9. The structure of claim 1, wherein the at least one gate structure comprises a single gate structure and a single current path is under the single gate structure.

10. The structure of claim 9, wherein the at least one gate structure is along a width of the first well.

11. The structure of claim 1, wherein the at least one gate structure is remotely positioned from the second well.

12. The structure of claim 1, wherein the at least one gate structure comprises polysilicon material with a trench in the semiconductor substrate.

13. The structure of claim 1, further comprising diffusion regions in the first well and the second well, wherein the plurality of shallow trench isolation structures extending into the first well and the second well isolate the diffusion regions.

14. A structure comprising:
a first well in a semiconductor substrate and electrically coupled to an anode;
a second well in the semiconductor substrate and electrically coupled to a cathode; and
at least one vertical gate structure extending vertically within the semiconductor substrate and which sits between the anode and the cathode,
wherein the at least one vertical gate structure comprises a plurality of vertical gate structures sitting within the second well.

15. The structure of claim 14, further comprising at least one shallow trench isolation structure abutting the plurality of vertical gate structures.

16. The structure of claim 15, wherein the second well comprises a P+ well and the first well comprises an N+ well abutting the P+ well.

17. The structure of claim 16, wherein the plurality of gate structures extend through the P+ well.

18. The structure of claim 14, wherein the second well comprises an N-well.

19. A method comprising:
forming a first well in a semiconductor substrate;
forming a second well in the semiconductor substrate, adjacent to the first well;
forming a plurality of shallow trench isolation structures extending into the first well and the second well; and
forming at least one vertical gate structure in the first well which abuts one shallow trench isolation structure of the plurality of shallow trench isolation structures, and below a bottom surface of the first well.

* * * * *